United States Patent [19]

Jordan et al.

[11] Patent Number: 5,038,858
[45] Date of Patent: Aug. 13, 1991

[54] FINNED HEAT SINK AND METHOD OF MANUFACTURE

[75] Inventors: William D. Jordan, Dallas; Donald L. Clemens, The Colony, both of Tex.

[73] Assignee: Thermalloy Incorporated, Dallas, Tex.

[21] Appl. No.: 492,926

[22] Filed: Mar. 13, 1990

[51] Int. Cl.⁵ .................... F28F 7/00; H02B 1/56; H05K 7/20
[52] U.S. Cl. .................... 165/185; 165/80.3; 361/382; 361/383
[58] Field of Search .............. 361/382, 383; 165/80.2, 165/80.3, 185

[56] References Cited

U.S. PATENT DOCUMENTS

| | | | |
|---|---|---|---|
| 1,766,701 | 6/1930 | Blackmore | 165/185 |
| 3,299,948 | 1/1967 | Kudola, Jr. | 165/185 |
| 4,193,444 | 3/1980 | Boyd et al. | 165/80.3 |
| 4,235,285 | 11/1980 | Johnson et al. | 165/80.3 |
| 4,322,776 | 3/1982 | Job et al. | 165/185 |
| 4,669,028 | 5/1987 | Faa, Jr. | 165/80.3 |
| 4,669,535 | 6/1987 | Seidler | 165/185 |
| 4,691,765 | 9/1987 | Wozniczka | 165/80.3 |
| 4,710,852 | 12/1987 | Keen | 165/80.3 |
| 4,751,963 | 6/1988 | Bui et al. | 165/80.3 |
| 4,879,891 | 11/1989 | Hinshaw | 165/80.3 |

FOREIGN PATENT DOCUMENTS

| | | | |
|---|---|---|---|
| 1100057 | 2/1961 | Fed. Rep. of Germany | 165/185 |
| 3415554 | 10/1984 | Fed. Rep. of Germany | 165/185 |
| 89371 | 8/1978 | Japan | 165/185 |
| 19643 | 2/1981 | Japan | 165/185 |
| 196552 | 12/1982 | Japan | 165/185 |
| 257157 | 12/1985 | Japan | 165/185 |

*Primary Examiner*—John Rivell
*Assistant Examiner*—L. R. Leo
*Attorney, Agent, or Firm*—Richards, Medlock & Andrews

[57] ABSTRACT

A finned heat sink is constructed from a base having parallel grooves with a latching lip. The fins are individually formed with a retaining boss adjacent one edge which is adapted to mate with the latching lip to secure the fin in the groove. Spacing tabs are formed on the fins to assure uniform parallel spacing between the fins when assembled.

14 Claims, 1 Drawing Sheet

U.S. Patent      Aug. 13, 1991      5,038,858
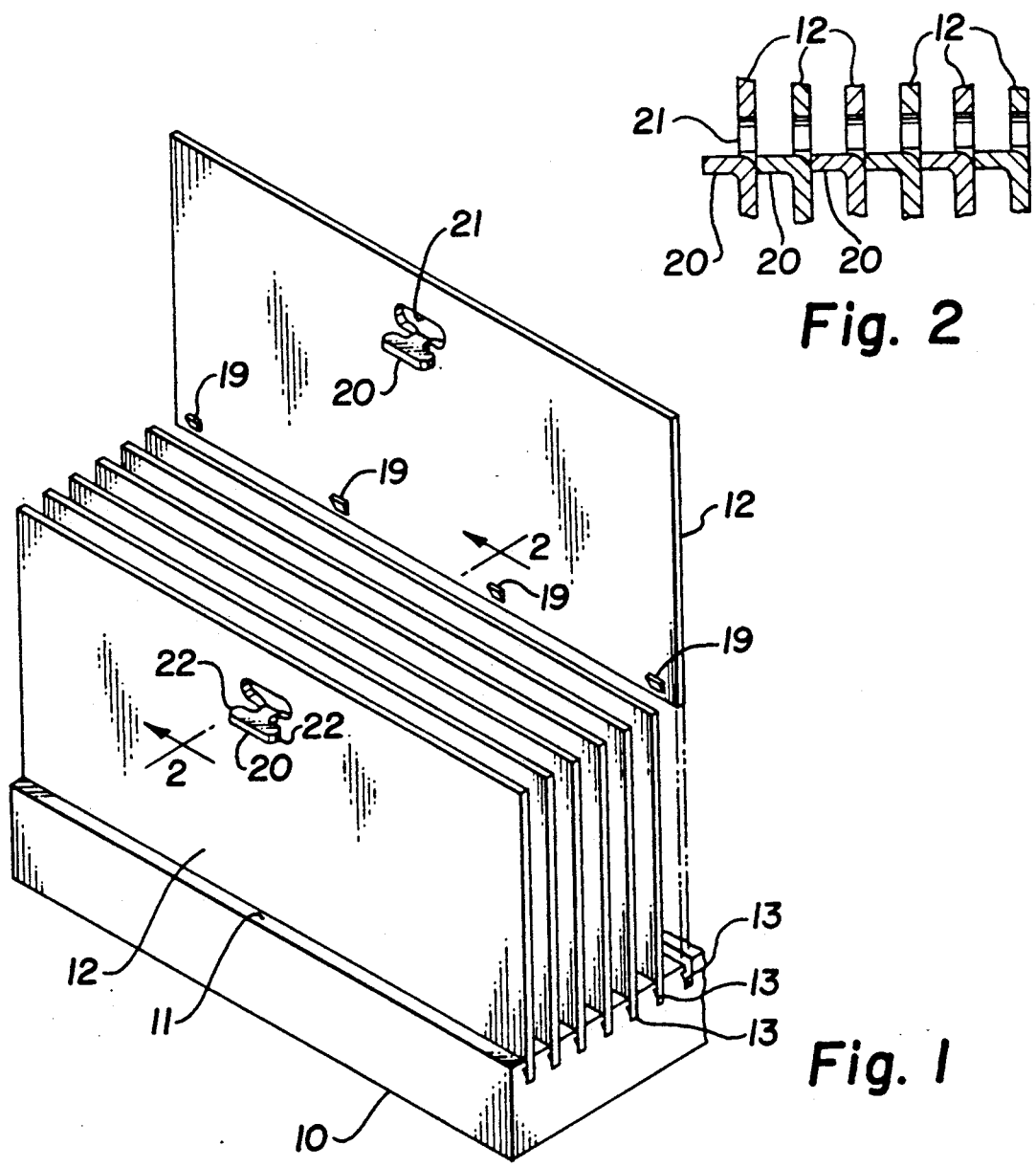
Fig. 2
Fig. 1
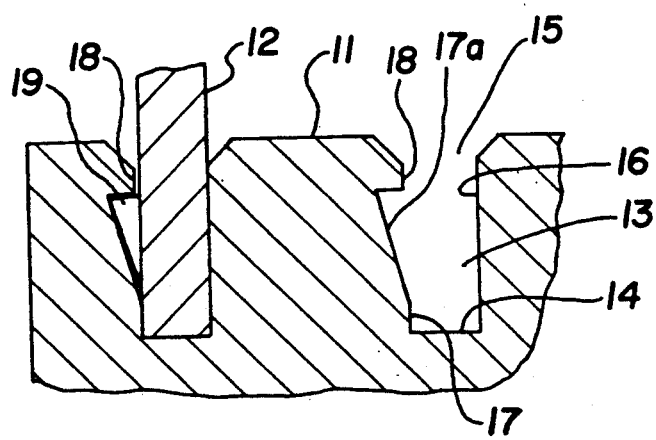
Fig. 3

5,038,858

FINNED HEAT SINK AND METHOD OF MANUFACTURE

FIELD OF THE INVENTION

This invention relates to heat dispersion apparatus. More particularly, it relates to finned heat sink bodies and methods of making same.

BACKGROUND OF THE INVENTION

Dissipation of heat energy may be accomplished in various ways. Where this heat energy is relatively small, it is quite common to use a body of thermally conductive material to absorb heat from the heated surface and dissipate the heat into the surrounding environment by radiation, convection, etc. Such heat sinks commonly employ thermally conductive fins or pins to increase the surface area of the heat sink exposed to the surrounding environment, thus increasing the efficiency of heat dissipation.

Electronic devices generally produce heat energy which must be removed from the device. Small semiconductor devices, for example, commonly employ a finned heat sink adjacent the device package to remove excess heat. Frequently, large numbers of heat producing devices are employed in an apparatus and thus collectively produce sufficient excess heat to cause serious problems unless effectively dissipated. In such cases it is common to employ a relatively large heat sink body from which extend relatively large area fins.

Since cost and efficiency are the major factors considered, heat sinks are usually made from aluminum or aluminum alloys and, since such materials can be readily and inexpensively extruded as shaped parts, extrusion is usually the preferred method of manufacturing heat sinks. However, where relatively large area, thin and closely spaced fins are desired, extrusion cannot be used. Instead, a heat sink base is formed with closely spaced grooves therein, either by extrusion or other suitable process, and individual plates or fins inserted into the grooves to form a body using large area, thin, closely spaced fins. However, the fins must be physically retained in the grooves and in intimate physical contact with the base in order to provide the heat dissipation required. Thermally conductive adhesives are ordinarily used for the purpose. However, adhesive bonding is time-consuming, labor intensive and expensive. Furthermore, even the best thermally conductive adhesives do not provide the thermal conductivity of unitary or metal-to-metal assemblies.

SUMMARY OF THE INVENTION

In accordance with the present invention, relatively large finned heat sink assemblies can be fabricated without the use of any bonding materials. Instead, grooves are formed on the base which include a mechanical latch mating with retaining means formed in the fins. The latch and retainer are formed to provide a strong intimate metal-to-metal bond between the base and the fin and may be assembled by simple mechanical insertion of the fins within the grooves. Moreover, the base may be formed from extruded stock in the required configuration and the fins can be formed from sheet stock by simple stamping and cutting procedures. Since assembly is accomplished by simple direct insertion without the use of adhesives, the entire manufacturing and assembly process can be fully automated. Furthermore, since the fins are securely mechanically locked within the grooves without the use of adhesives, improved thermal transfer between the base and the fins is achieved. These and other features and advantages of the invention will become more readily understood from the following detailed description taken in connection with the appended claims and attached drawing in which:

BRIEF DESCRIPTION OF THE DRAWING

FIG. 1 is a perspective view, partially exploded, illustrating the preferred embodiment of a heat sink assembly employing the invention;

FIG. 2 is a partial sectional view of the assembly of FIG. 1 taken through line 2—2; and FIG. 3 is a partial sectional view illustrating the latch mechanism of the heat sink assembly of FIG. 1.

DETAILED DESCRIPTION

The construction details of a presently preferred embodiment of the invention are illustrated in FIGS. 1-3. The heat sink comprises base 10 which has a substantially flat top surface 11. It will be readily recognized that the base 10 may be formed of any desired size or shape depending upon the use for which it is intended. The base 10 need only be of a thermally conductive material and have a thickness and rigidity sufficient to accommodate grooves 13 as described hereinafter.

A plurality of parallel grooves 13 (shown in detail in FIG. 3) are formed in the top surface 11 of base 10. Grooves 13 are formed to define a bottom 14, a top opening 15 and opposed sidewalls 16 and 17. A portion 17a of one side wall is canted outwardly with respect to the other sidewall to define an inwardly projecting lip 18 near the top opening 15 of the groove 13. It will be readily recognized that the dimensions of groove 13 will be predetermined by the thickness of the fin to be fitted therein, it being understood that the width of the groove is to substantially correspond with the original thickness of the material used for the fins.

Grooves 13 may be formed by any of various conventional procedures. Preferably, in order to reduce manufacturing costs the base 10 may be formed as an extruded part with the grooves formed during the extrusion. Of course, grooves can be formed by sawing, milling, etc., if desired.

The fins 12 may be formed from suitable sheet material by conventional stamping and cutting techniques. In the preferred embodiment, each fin 12 is a rectangular sheet of thermally conductive material of finite thickness substantially corresponding to the width of groove 13. A plurality of bosses 19 are aligned parallel with and slightly spaced from the lower edge of each fin 12. In the preferred embodiment, the bosses 19 are formed by a wedge-shaped die which punches a small flap from the material of the fin 12 so that the free end of the flap extends outwardly from the face of the fin. Depending, of course, on the thickness of the material of the fin 12, the boss 19 may not be cut as a free flap. It may be formed as a wedge, dimple or the like. In order to perform the functions described, the boss 19 must only be appropriately positioned so that a surface thereof will act as a retainer against the lower surface of the lip 18 which serves as a latch means.

The heat sink of FIG. 1 is assembled by forcing fins 12 into grooves 13 as illustrated in FIGS. 1 and 3. The fin 12 is inserted vertically into the groove 13 with the side having bosses 19 projecting toward the sidewall of the groove 13 which has the inwardly projecting lip 18. In the preferred embodiment the boss 19 is wedged-shaped as illustrated in FIG. 3 and extends outwardly from the face of fin 12 a sufficient distance to mate with the slanted portion 17a of sidewall 17. Thus the wedge 19 must be forced past lip 18. However, since the base 10 and fin 12 are both formed of thermally conductive metal, the metal parts are sufficiently resilient to permit the insertion of the fin 12 under sufficient force to squeeze the boss 19 past lip 18 at which time it springs to the latching position illustrated in FIG. 3. When fully inserted the lip 18 acts as a latching means against the boss 19 which acts as a retainer so that the fin is securely latched and retained within the groove 13.

It should be noted that the entire assembly is accomplished without use of adhesive materials and, since the width of the groove 13 is predetermined to approximate the thickness of the fin 12 and since the latching mechanism parts are force-fitted together, intimate metal-to-metal contact is formed between the fin 12 and the base 10 along wall 16 of the groove.

While the invention is illustrated as utilizing vertical channels to accommodate vertically extending fins 12, it will be readily recognized that the grooves could be formed at an angle with respect to the top surface 11 so that the fins would extend outwardly at an angle with respect to the base, if desired.

If all the grooves, bosses and latching mechanisms are precisely formed and the fins 12 are of uniform thickness and planarity, the fins 12 will extend vertically from the surface 12 aligned perfectly parallel with each other. However, it will be recognized that if the grooves 13 are formed by extrusion or the like and stock material is used for the fins 12, variances in thickness and flatness of the fins 12 as well as variances in width and planarity of the grooves will be encountered. Accordingly, when assembled the fins 12 may not extend perfectly vertically and may not be perfectly parallel with each other. In order to maximize the thermal transfer efficiency between the fins and air circulating therebetween, it is desired that the spacing between fins be substantially uniform and therefore that the fins extend substantially parallel with each other. In order to assure uniform spacing between the fins, various spacers which do not substantially interfere with airflow may be used. In the preferred embodiment, a tab 20 is formed in each fin 12, preferably near the top edge (the edge of the fin opposite the edge inserted into base 10). The tab 20 is preferably formed by a die-cutting and stamping operation wherein one end of tab 20 is cut from the fin 12 and bent outwardly substantially 90° as illustrated in FIGS. 1 and 2. The base of the tab, of course, remains joined with the fin 12. As illustrated in FIG. 2, the tab 20 is folded to extend outwardly from the face of the fin 12 a distance which coincides with the desired spacing between the fins 12. Thus, when the fins are assembled within the base, the tabs 20 provide a predetermined spacing between each adjacent fin. However, since the tab 20, when formed, leaves a hole 21 in the fin 12, the tab 20 is preferably cut with at least one ear 22 (two of which are shown in FIG. 1). The free end of tab 20 is then folded sufficiently downward so that the outer end of the tab 20 presents a face broader than the hole in the adjacent fin. Accordingly, when the fins are assembled as illustrated in FIG. 2, each tab 20 mates with the surface of an adjacent fin at the base of the tab 20 and thus will not project through the hole formed in the adjacent fin by formation of the tab.

It will be readily recognized that the shape of tab 20 may vary as desired and that more than one tab may be used if desired. Furthermore, tabs may be placed at other locations on the fin 12 and may be formed to bend upwardly, downwardly or to either side and still provide the desired function.

From the foregoing it will be readily recognized that finned heat sinks of any desired dimensions can be fabricated in accordance with the invention. Furthermore, base 10 stock can be extruded and cut to desired dimensions as needed. Likewise, fins of various sizes and shapes can be formed as needed to produce finned heat sinks of any desired size or configuration. Since the assembly can be performed without adhesives, the heat sink assemblies can be shipped disassembled if desired and assembled at the point of use to reduce shipping costs.

The principles of the invention can be applied to forming heat sinks of any desired fin surface area by simply varying the size of the fins. Where the fins are made from the same thickness of sheet stock, larger or smaller fins can be used in conjunction with standard size grooves in the base. Thus a wide variety of heat sink assembles can be formed from a minimum variety of stock parts. Furthermore, while the invention has been described with respect to a lip on only one edge mating with retaining means extending from one face of the fin, it will be recognized that lips could be formed on both sidewalls of the groove and retaining bosses formed on both or either face of the fin. However, in the preferred embodiment one wall of the groove is flat so that the edge of the fin inserted within the groove makes a broad area contact with the base to improve thermal transfer efficiency. It will be understood, therefore, that although the invention has been described with particular reference to a specific embodiment thereof, the form of the invention shown and described in detail is to be taken as the preferred embodiment of same and that various changes and modifications can be resorted to without departing from the spirit and scope of the invention as defined by the appended claims.

What is claimed:

1. A heat sink comprising:
   (a) a body of thermally conductive material having a first major face with at least one elongated groove therein defining a channel with a bottom, a top opening and opposed sidewalls;
   (b) latch means formed within said groove;
   (c) a relatively thin and substantially planar sheet of thermally conductive material having a thickness approximately the width of said groove with one edge of said sheet nested within said groove; and
   (d) retaining means extending from one face of said sheet near said one edge thereof mating with said latch means to retain said sheet within said groove.

2. A heat sink as defined in claim 1 wherein said latch means comprises a lip on one of said sidewalls projecting toward the other of said sidewalls.

3. A heat sink as defined in claim 2 wherein said retaining means comprises at least one protrusion extending from said one face of said sheet adapted to mate with said lip.

4. A heat sink as defined in claim 3 wherein said protrusion is wedge-shaped.

5. A heat sink as defined in claim 1 including a spacing tab extending from one face of said sheet of conductive material.

6. A heat sink as defined in claim 5 wherein said tab has a free end and a base connected to said sheet of conductive material, and wherein said tab is bent to extend outwardly from the face of said sheet a distance corresponding to the desired spacing between adjacent sheets of conductive material.

7. A heat sink comprising:
(a) an elongated body of thermally conductive material having a first major face and a plurality of substantially parallel channels in said first major face, each said channel have a top opening, a bottom and a first sidewall lying in a plane connecting the top opening and the bottom and a second sidewall disposed opposite said first sidewall, said second sidewall having latch means projecting therefrom toward said first sidewall; and
(b) a relatively thin planar fin secured within at least one of said channels, said fin comprising a sheet of thermally conductive material having a thickness approximately equal to the width of said channels and retaining means extending from one face thereof, said retaining means positioned within said channel and mating with said latch means positioned within said channel and maintaining said fin in intimate physical contact with said first sidewall.

8. A heat sink as defined in claim 7 wherein said second sidewall of said channel is slanted outwardly with respect to said first sidewall and said latch means comprises a lip near said top opening.

9. A heat sink as defined in claim 7 wherein said retaining means is at least one protrusion projecting from the plane of one face of said fin.

10. A heat sink as defined in claim 9 wherein said protrusion is wedge-shaped.

11. A heat sink as defined in claim 9 wherein said protrusion is a flap punched from said fin.

12. A heat sink as defined in claim 7 including spacing means adapted to position said fin parallel with an adjacent fin.

13. A heat sink as defined in claim 12 wherein said spacing means comprises a flap punched from said fin.

14. The method of making a finned heat sink comprising the steps of:
(a) forming a body of thermally conductive material having a first major face;
(b) forming a plurality of substantially parallel grooves in said first major face, each groove having a lip projecting inwardly from at least one side thereof;
(c) forming a plurality of fins, each comprising a substantially flat planar body with opposed substantially parallel major faces;
(d) forming retaining means on at least one major face of each of said fins, said retaining means projecting outwardly from said one major face near an edge thereof; and
(e) inserting the edge of each fin having said retaining means within a groove by forcing said edge to move in a direction normal to said first major face so that said retaining means moves past and mates with said lip to retain said fin within said groove.

* * * * *

UNITED STATES PATENT AND TRADEMARK OFFICE
CERTIFICATE OF CORRECTION

PATENT NO. : 5,038,858
DATED : August 13, 1991
INVENTOR(S) : William D. Jordan, et al.

It is certified that error appears in the above-identified patent and that said Letters Patent is hereby corrected as shown below:

Column 5, line 12, change "have" to ---having---

Signed and Sealed this

Third Day of November, 1992

*Attest:*

DOUGLAS B. COMER

*Attesting Officer*    Acting Commissioner of Patents and Trademarks